US007753163B2

(12) United States Patent
Bouchard

(10) Patent No.: US 7,753,163 B2
(45) Date of Patent: Jul. 13, 2010

(54) MULTI-FREQUENCY ACOUSTIC VIBRATION TRANSMISSION METHOD AND SYSTEM

(75) Inventor: Gilbert Bouchard, Boisbriand (CA)

(73) Assignee: 9168-1478 Quebec Inc., Boisbriand, Quebec (CA)

( * ) Notice: Subject to any disclaimer, the term of this patent is extended or adjusted under 35 U.S.C. 154(b) by 1453 days.

(21) Appl. No.: 10/489,541

(22) PCT Filed: Sep. 13, 2002

(86) PCT No.: PCT/CA02/01412

§ 371 (c)(1),
(2), (4) Date: Mar. 12, 2004

(87) PCT Pub. No.: WO03/023762

PCT Pub. Date: Mar. 20, 2003

(65) Prior Publication Data

US 2004/0251747 A1 Dec. 16, 2004

(30) Foreign Application Priority Data

Sep. 13, 2001 (CA) .................................... 2357304
Dec. 5, 2001 (CA) .................................... 2364129
Apr. 25, 2002 (CA) .................................... 2382310

(51) Int. Cl.
*H05K 5/00* (2006.01)

(52) U.S. Cl. ....................... 181/148; 181/179; 181/199; 181/196; 181/150; 381/301; 381/388; 381/386

(58) Field of Classification Search ................. 181/148, 181/179, 152, 199, 192, 196, 141, 150, 144, 181/145, 147, 153, 160, 161, 167, 169, 30; 601/46, 47, 48, 49, 55, 57, 58, 64; 310/10; 381/301, 388, 386; 297/452.13, 452.37, 297/217.4, 217.3, 217.5; 5/904
See application file for complete search history.

(56) References Cited

U.S. PATENT DOCUMENTS 3,019,050 A * 1/1962 Spielman ................. 297/217.3
3,113,633 A * 12/1963 Eberhardt et al. ........... 181/145
3,385,393 A * 5/1968 Gold .......................... 181/141
3,512,605 A * 5/1970 McCorkle ................... 381/301

(Continued)

FOREIGN PATENT DOCUMENTS

GB 1582577 A 1/1981

(Continued)

*Primary Examiner*—Jeffrey Donels
*Assistant Examiner*—Forrest M Phillips
(74) *Attorney, Agent, or Firm*—Sunstein Kann Murphy & Timbers LLP

(57) ABSTRACT

A method and system (50) for inducing multi-frequency vibrations in a vibration propagating structure, for example a seat (52), is disclosed. The system is comprised of an acoustic vibration transducer unit (12) mounted on a relatively flat and rigid surface (54') such that the direction of movement of an actuating element in the unit is parallel to the surface. When the unit is driven by an amplified low frequency audio signal a person sitting in the seat experiences vibrations. Additionally, a series of vibration propagating structures, for example a row of seats at a movie theatre, can be connected in series via vibration-propagating members (60) between adjacent seats thereby allowing a single acoustic vibration transducer unit to propagate vibrations to all connected seats.

12 Claims, 4 Drawing Sheets

U.S. PATENT DOCUMENTS

| | | | | | |
|---|---|---|---|---|---|
| 3,923,300 | A | * | 12/1975 | Tanus | 472/60 |
| 3,999,014 | A | * | 12/1976 | Bascom | 381/76 |
| 4,023,566 | A | * | 5/1977 | Martinmaas | 601/47 |
| 4,064,376 | A | * | 12/1977 | Yamada | 381/152 |
| 4,124,249 | A | * | 11/1978 | Abbeloos | 297/217.4 |
| 4,237,341 | A | * | 12/1980 | Richards | 381/75 |
| 4,490,842 | A | * | 12/1984 | Watanabe | 381/86 |
| 4,696,370 | A | * | 9/1987 | Tokumo et al. | 181/141 |
| 4,750,208 | A | * | 6/1988 | Yamada et al. | 381/162 |
| 4,752,065 | A | * | 6/1988 | Trumbull et al. | 472/60 |
| 4,758,047 | A | * | 7/1988 | Hennington | 297/397 |
| 4,778,027 | A | * | 10/1988 | Taylor | 181/175 |
| 4,826,245 | A | * | 5/1989 | Entratter | 297/217.5 |
| 5,086,755 | A | * | 2/1992 | Schmid-Eilber | 601/47 |
| 5,096,252 | A | * | 3/1992 | Brown | 296/63 |
| 5,101,810 | A | * | 4/1992 | Skille et al. | 601/47 |
| 5,106,159 | A | * | 4/1992 | Iwamoto | 297/411.27 |
| 5,170,435 | A | * | 12/1992 | Rosen et al. | 381/86 |
| 5,218,175 | A | * | 6/1993 | Scarlata | 181/141 |
| 5,282,251 | A | * | 1/1994 | Petersen | 381/333 |
| 5,368,359 | A | * | 11/1994 | Eakin | 297/217.4 |
| 5,398,992 | A | * | 3/1995 | Daniels | 297/217.4 |
| 5,442,710 | A | * | 8/1995 | Komatsu | 381/162 |
| 5,573,320 | A | * | 11/1996 | Shearer | 312/223.3 |
| 5,624,155 | A | | 4/1997 | Bluen | 297/217.3 |
| 5,624,156 | A | * | 4/1997 | Leal et al. | 297/217.4 |
| 5,678,889 | A | * | 10/1997 | Purcell, Jr. | 297/257 |
| 5,730,707 | A | * | 3/1998 | Vang | 601/49 |
| 5,807,177 | A | * | 9/1998 | Takemoto et al. | 463/47 |
| 5,838,808 | A | * | 11/1998 | Prosser | 381/388 |
| 6,021,208 | A | * | 2/2000 | Kin-Lung | 381/338 |
| 6,024,407 | A | * | 2/2000 | Eakin | 297/217.4 |
| 6,024,647 | A | * | 2/2000 | Bennett et al. | 472/43 |
| 6,053,880 | A | * | 4/2000 | Sleichter, III | 601/57 |
| 6,056,357 | A | * | 5/2000 | Fukuoka | 297/217.3 |
| 6,216,927 | B1 | * | 4/2001 | Meritt | 224/275 |
| 6,369,312 | B1 | * | 4/2002 | Komatsu | 84/723 |
| 6,585,515 | B1 | * | 7/2003 | Roy et al. | 434/55 |
| 6,991,289 | B2 | * | 1/2006 | House | 297/217.4 |
| 7,127,075 | B2 | * | 10/2006 | Park | 381/151 |
| 7,130,440 | B2 | * | 10/2006 | Maekawa et al. | 381/389 |
| 7,318,795 | B2 | * | 1/2008 | Dauterive | 482/148 |
| 7,347,493 | B2 | * | 3/2008 | Mulmed | 297/233 |
| 7,367,886 | B2 | * | 5/2008 | Loose et al. | 463/35 |
| 2003/0152245 | A1 | * | 8/2003 | Maekawa et al. | 381/388 |
| 2004/0047484 | A1 | * | 3/2004 | Gardenier et al. | 381/333 |
| 2005/0117767 | A1 | * | 6/2005 | Ito et al. | 381/333 |
| 2006/0082198 | A1 | * | 4/2006 | Mafrice et al. | 297/217.4 |
| 2006/0186714 | A1 | * | 8/2006 | Terno et al. | 297/217.3 |
| 2006/0284459 | A1 | * | 12/2006 | Real et al. | 297/217.3 |
| 2007/0024097 | A1 | * | 2/2007 | Shiraishi | 297/217.4 |
| 2007/0052267 | A1 | * | 3/2007 | Dodd | 297/217.3 |
| 2007/0252417 | A1 | * | 11/2007 | Neustat | 297/217.1 |
| 2007/0257529 | A1 | * | 11/2007 | Matsuhashi | 297/217.4 |
| 2007/0257530 | A1 | * | 11/2007 | Florez et al. | 297/217.4 |
| 2008/0100106 | A1 | * | 5/2008 | Dragusin | 297/217.3 |
| 2008/0111408 | A1 | * | 5/2008 | Duran et al. | 297/217.4 |

FOREIGN PATENT DOCUMENTS

| | | | | |
|---|---|---|---|---|
| GB | 2295713 | A | | 6/1996 |
| JP | 03132198 | A | * | 6/1991 |
| JP | 04341215 | A | * | 11/1992 |

* cited by examiner

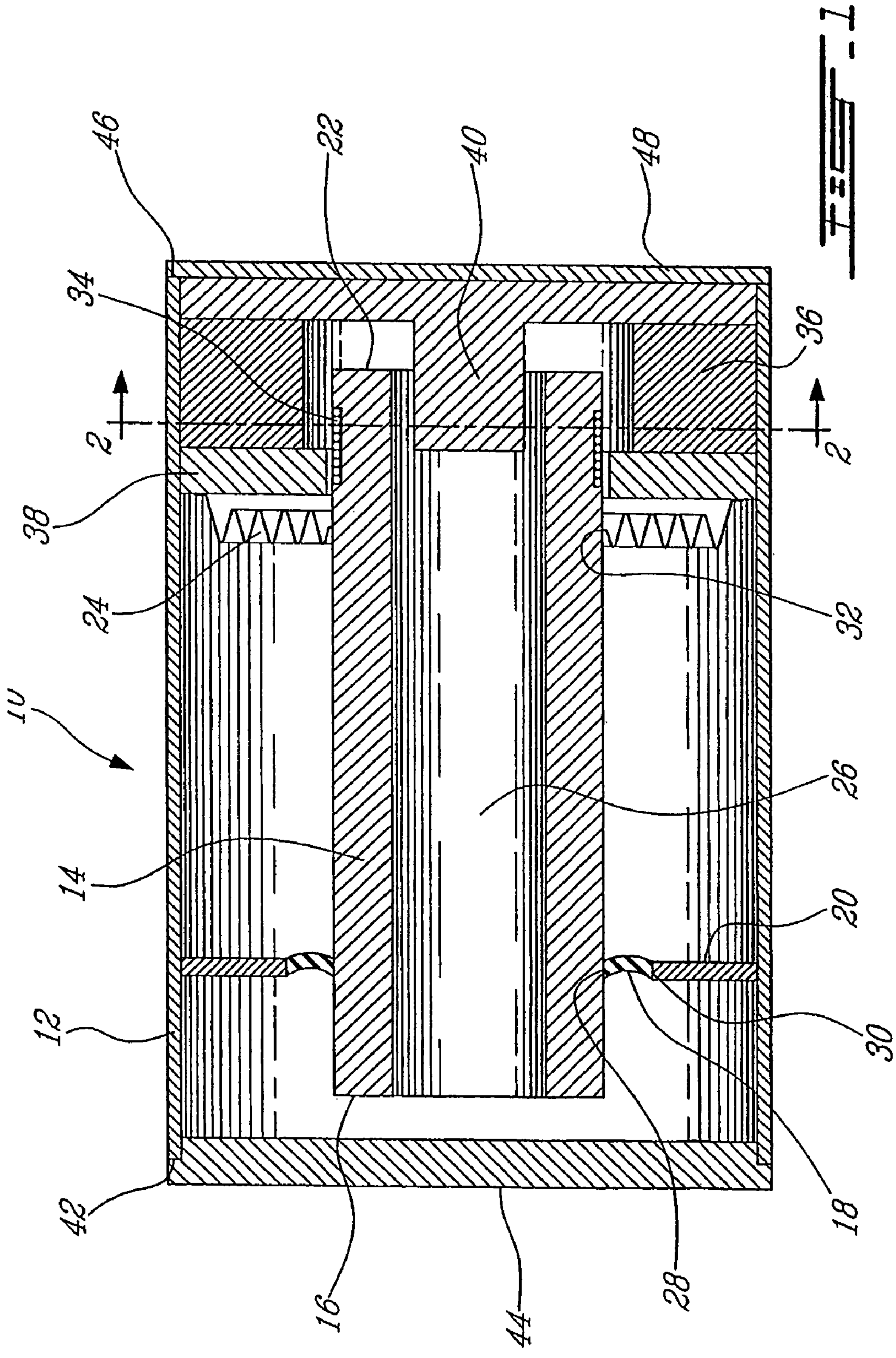
46
22
40
48
34
36
2
2
38
24
32
10
26
14
20
12
30
18
42
16
44
28

MULTI-FREQUENCY ACOUSTIC VIBRATION TRANSMISSION METHOD AND SYSTEM

CROSS REFERENCE TO RELATED APPLICATIONS

The present application is a National Phase application of International Application No. PCT/CA02/01412, filed 13 Sep. 2002, which claims priority from Canadian Application Nos. 2,357,304, filed 13 Sep. 2001, 2,364,129, filed 5 Dec. 2001 and 2,382,310, filed 25 Apr. 2002. All of the above referenced applications are hereby incorporated herein by reference.

TECHNICAL FIELD

The present invention relates to an apparatus and system for the transmission of multi-frequency acoustic vibrations. In particular, the present invention relates to a method and system for the transmission of low frequency audio signals recorded on a film, video or music soundtrack in the form of vibrations which can be sensed by a viewer/listener.

BACKGROUND ART

Given that deep base vibrations are generally found to be sympathetic to the listener, in order to enhance the audio component of an entertainment system a number of systems have been proposed which convert the bass audio signal to a vibration. These systems typically include a transducer, motor or other mechanical device which is capable of converting the audio input signal into a vibration. As a result, instead of or in addition to being heard, the bass signal is perceived through tactile senses.

Additionally, imparting a vibration to the viewer of a moving image which is synchronized with the moving image provides an additional dimension which can be exploited in order to enhance the viewing experience. Therefore, a variety of entertainment and simulation systems have been proposed which combine projected images with synchronised movement and vibrations. The prior art reveals systems which use high intensity, low frequency noise synchronized to a projected moving picture film or video to produce physiological sensations, for example a shaking sensation to simulate the effect of an earthquake, in the audience. Earlier prior art systems conduct movement or vibrations to a seated, or in some cases standing, viewer or viewers by a variety of mechanical means, including those based on the control of compressed air or hydraulics.

The introduction of multi-track digital audio combined with moving picture film or high resolution video projectors has lead to an increase in the common place combination of moving projected images with complex and high quality directional hi-fidelity audio sound tracks. In a home entertainment system, for example, typically five (5) audio channels are used to supply input to four (4) satellite speakers positioned around the viewer and a single front speaker while a sixth audio channel is used to supply a lower frequency subwoofer bass speaker. In some cases a high intensity, low frequency sound supplied to the bass speaker provides the viewer with the sensation of vibrations. In order to further amplify the vibrations a variety of acoustic transducers have been proposed which, when supplied with an appropriate low frequency audio signal, generate high intensity vibrations which can be perceived through tactile senses but not heard.

Known in the art are acoustic transducers where the moving element is deflected in a direction generally perpendicular to a rigid surface to which the transducer is attached. The prior art also discloses acoustic transducers which are securely mounted to a hard relatively flat surface, for example a floor, a chair back or underneath the base of a chair. The transducers use the surface to which they are mounted as a means for transmitting vibrations to a person or persons in contact with the surface. These prior art acoustic transducers generate vibrations either percussively, for example by repeatedly rapping the cam of a solenoid against the hard flat surface, or by accelerating a relatively large mass back and forth relative to the surface. In both these prior art assemblies the movement of the cam or the mass is perpendicular to the surface to which the acoustic transducer is attached.

One drawback of the above prior art acoustic transducers is that the transducer has a characteristically uneven frequency response with a dominant resonant frequency being generally excited when the surface is struck. This frequency is independent of the frequency or force with which the surface is hit. Still another drawback is that the vibrations propagate in only a limited manner and therefore in large installations such as cinemas a large number of transducers are needed in order to convey the vibrations to the entire audience. An additional drawback is that in all installations in order to successfully induce vibrations the acoustic transducer(s) must be securely mounted to a rigid surface which leads to difficulties in installation and removal, especially for home applications.

SUMMARY OF THE INVENTION

The present invention overcomes the above and other drawbacks by providing a method of inducing multi-frequency acoustic vibrations in a vibration-propagating structure. The method comprises positioning an elongate vibrating member generally parallel to and in physical contact with the structure and producing in the elongate vibrating member the multi-frequency acoustic vibrations. The multi-frequency acoustic vibrations propagate both through the elongate vibrating member and the structure in physical contact with the elongate vibrating member and induce in the structure the multi-frequency acoustic vibrations.

Also provided is a method of inducing multi-frequency acoustic vibrations in a series of vibration-propagating structures. The method comprises positioning an elongate vibrating member in physical contact with a first one of the structures and in a direction generally parallel to the series of structures. The direction constitutes a direction of propagation of the multi-frequency acoustic vibrations. Each pair of mutually adjacent structures of the series are interconnected through an elongate vibration-propagating member generally parallel to the direction of propagation. The multi-frequency acoustic vibrations are produced in the elongate vibrating member which are propagated in the direction of propagation from the elongate vibrating member, the first structure, and the other structures of the series through the elongate wave-propagating members.

Additionally, a system for inducing multi-frequency acoustic vibrations in a vibration-propagating structure is provided. The system is comprised of an elongate vibrating member for being positioned generally parallel to and in physical contact with the structure and a generator of the multi-frequency acoustic vibrations connected to the elongate vibrating member. In operation, the generator produces the multi-frequency acoustic vibrations in the elongate vibrating member. The multi-frequency acoustic vibrations are propagated both through the elongate vibrating member and the structure in physical contact with the elongate vibrating member to induce in the structure the multi-frequency acoustic vibrations.

In a particular embodiment the generator is mounted within the elongate vibrating member to form an acoustic vibration transducer unit.

Furthermore, in a particular embodiment the vibration-propagating structure comprises a seating unit with cushions wherein the acoustic vibration transducer unit is adapted to be positioned parallel to and transversally of the seating unit between cushions of the seating unit.

Also, in a particular embodiment the vibration-propagating structure comprises a seating unit with a backrest having a rear face and the acoustic vibration transducer unit is fastened horizontally and transversally to the rear face of the backrest and extends generally parallel to the rear face of the backrest.

There is also provided a system for inducing multi-frequency acoustic vibrations in a series of vibration-propagating structures. The system comprises an elongate vibrating member for being positioned in physical contact with a first one of the structures and in a direction generally parallel to the series of structures, the direction constituting a direction of propagation of the multi-frequency acoustic vibrations. A generator of multi-frequency acoustic vibrations connected to the elongate vibrating member. Additionally, an elongate vibration-propagating member for interconnecting each pair of mutually adjacent structures of the series is provided for. The elongate vibration-propagating member is generally parallel to the direction of propagation. In operation, the generator produces the multi-frequency acoustic vibrations in the elongate vibrating member, and the multi-frequency acoustic vibrations propagate in the direction of propagation from the elongate vibrating member, the first structure, and the other structures of the series through the elongate wave-propagating members.

In a particular embodiment the elongate vibrating member is cylindrical.

In another particular embodiment the generator is mounted within the elongate vibrating member to form an acoustic vibration transducer unit.

In still another particular embodiment the elongate vibration-propagating members are tubular.

In another particular embodiment the vibration-propagating structures each comprise a seating unit with a backrest having a rear face and the elongate vibrating member is fastened to the rear face of the backrest of one of the seating units and extends generally parallel to the direction of propagation of the multi-frequency acoustic vibrations.

In still another particular embodiment the series of vibration-propagating structures comprises a row of seating units each having a backrest with a rear face. The elongate vibration-propagating members each interconnect the rear faces of the backrests of two adjacent seating units corresponding to one pair of mutually adjacent vibration-propagating structures and extend generally parallel to the direction of propagation of the multi-frequency acoustic vibrations.

BRIEF DESCRIPTION OF THE DRAWINGS

The foregoing features of the invention will be more readily understood by reference to the following detailed description, taken with reference to the accompanying drawings, in which:

FIG. 1 is a cross-sectional view of an acoustic vibration transducer in accordance with an illustrative embodiment of the present invention;

DETAILED DESCRIPTION OF SPECIFIC EMBODIMENTS

Figure 3:
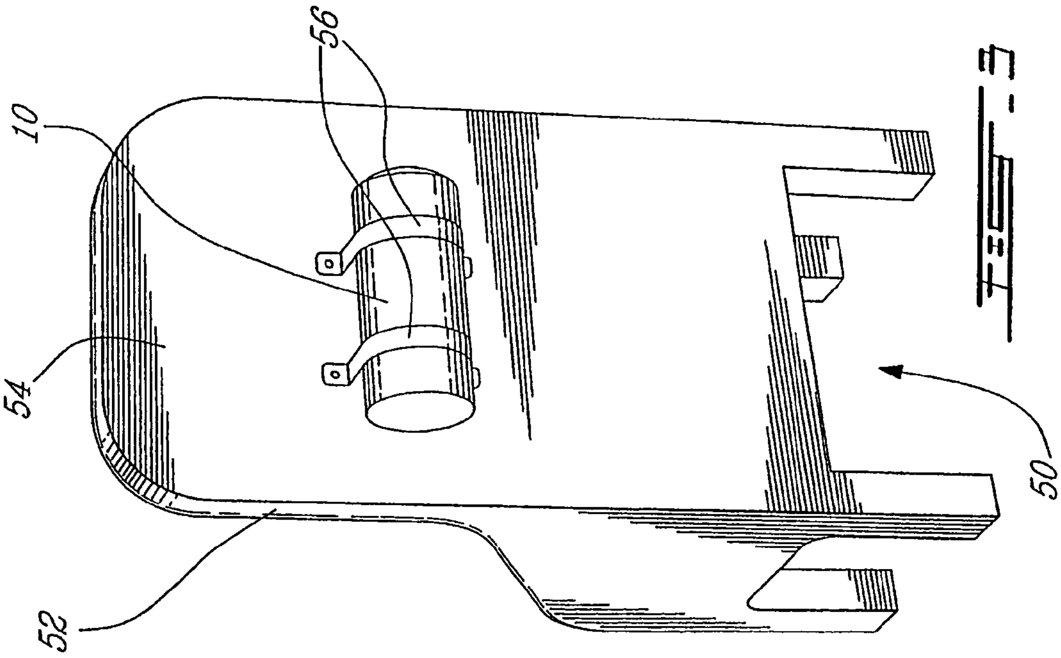
FIG. 3 is an elevated back view of a system for inducing multi-frequency acoustic vibrations in a structure in accordance with a particular illustrative embodiment of the present invention.

An illustrative embodiment of the acoustic vibration transducer and vibration transmission system will now be described.

In general, the operation of the vibration transmission system as described hereinbelow is as follows: A source of sound, such as a pre-recorded audio track or the soundtrack of a film, is fed into an amplifier which converts the audio track or soundtrack into a varying voltage. According to principles well known in the art, either the source of sound prior to amplification or the varying voltage is low pass filtered to form a low frequency voltage signal. The low frequency voltage signal is input to an inductive coil held in a strong magnetic field. Current passing through the coil induces a magnetic flux which causes the coil to be deflected by the magnetic field. The extent and direction of the deflection is related to both the direction and magnitude of the current passing through the coil. An actuating element on which the coil has been securely mounted is also deflected along with the coil. The actuating element induces vibrations in a transducer having frequencies and magnitudes related to those present in the input signal.

Referring now to FIG. 1, the acoustic vibration transducer is generally referred using the reference numeral 10. The acoustic vibration transducer 10 is comprised of a hollow elongate housing 12 fabricated from a rugged dense material providing a solid, rigid enclosure. In an illustrative embodiment the housing 12 is fabricated from a rolled laminated cardboard although it will be apparent to one of ordinary skill in the art that a variety of materials such as composites, fibreglass, PVC, plastic, metals such as aluminum or wood may also be suitable materials in a particular implementation. The housing 12 is preferably of cylindrical/tubular form although other elongate shapes, such as rectangular, will also be suitable.

An elongate actuating element 14 is suspended within and coaxial to the housing 12 towards a first end 16 by an annular suspension membrane 18 and annular rigid support 20 and towards the second end 22 by an annular support membrane 24. Suspended in this manner, the actuating element 14 is restricted in movement along an axis coaxial with the housing 12. In the illustrative embodiment the actuating element 14 is in the form of an elongate cylindrical tube which defines a hollow region 26. However, the cross section of the actuating element could be of another form, for example square or triangular. Additionally, the actuating element 14 could also be fabricated from a solid material or the hollow region 26 could be filled with material.

Additionally, in an illustrative embodiment the actuating element 14 is fabricated from a section of aluminum tubing although it will be apparent to one of ordinary skill in the art that a variety of materials such as a rolled laminated cardboard, composites, fibreglass, PVC, plastic, metals other than aluminum or wood may also be suitable materials in a particular implementation.

The suspension membrane 18 is fabricated from a pliant material which, although flexible, is resistant to stretching. The suspension membrane 18 is securely attached along an inside edge 28 to the actuating element 14 and along an outside edge 30 to the annular rigid support 20. Additionally, the suspension membrane 18 should be such that when no axial force is applied to the actuating element 14, the actuating element 14 returns to a predefined resting position. In an illustrative embodiment the suspension membrane 18 is fabricated from leather although other suitable materials such as nylon or other resilient cloths or materials may be used. The suspension membrane 18 transmits forces generated by movements of the actuating element 14 to the housing 12 via the rigid support 20.

The support membrane 24 is fabricated from a material which, although maintaining the second end 22 of the actuating element 14 in coaxial relation with the housing 12 and securely attached along an inside annular edge 32 to the actuating element 14, does not resist axial movement of the actuating element 14. In an illustrative embodiment the support membrane 24 is fabricated from a high quality paper which is folded into an accordion shape.

Figure 2:
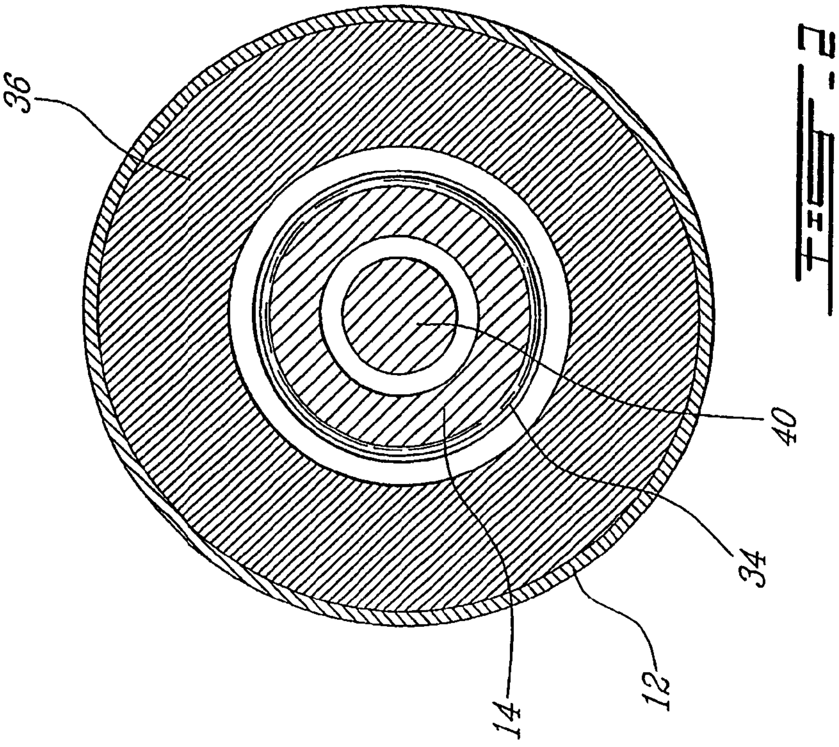
FIG. 2 is a cross-sectional view along 2-2 in FIG. 1 of an acoustic vibration transducer in accordance with an illustrative embodiment of the present invention.

Referring to FIG. 2 in addition to FIG. 1, the means for exciting the actuating element 14 to movement will now be described. The windings of an inductive coil 34 are wound around or imbedded in the outer surface of the actuating element 14. An annular permanent magnet 36 is sandwiched between an annular yoke plate 38 and back plate/t-yoke 40. Both the annular yoke plate 38 and the back plate/t-yoke 40 are typically fabricated from low carbon steel. As is well known to those of ordinary skill in the art the combination of the annular permanent magnet 36, yoke plate 38 and back plate/t-yoke 40 form a magnetic circuit and serve to concentrate the magnetic field (not shown) produced by the magnet 36 in the region of the inductive coil 34.

Application of an input signal across the inductive coil 34 causes the actuating element 14 to be deflected with a direction and magnitude proportional to the input signal in accordance with principles which are well known in the art. Application of a sinusoidal or complex sinusoidal input signal across the inductive coil 34 induces a reciprocating movement in the actuating element 14 with a magnitude and direction proportional to that of the input signal. This movement is transmitted by means of the suspension membrane 18/annular rigid support 20 assembly to the housing 12.

Although the means for exciting the actuating element 14 has been illustratively described in the form of a solenoid driven by a suitably amplified input signal, it will be understood to one of ordinary skill in the art that other exciting means could be used. For example the actuating element 14 could be formed entirely or partially of a ferrous metal and the inductive coil 34 wound around a portion of the housing 12. Other means could also be used including, for example, compressed air, hydraulics, etc.

Referring back to FIG. 1, the first end 42 of the housing 12 is enclosed by a cover 44 in order to protect the actuating element 14 from damage. The second end 46 of the housing 12 is also enclosed in a cover 48 although the backing plate/t-yoke assembly 40 can also in some configurations serve this purpose.

Depending on the type of installation, the diameter of the housing 12 is sufficiently small, typically around ten (10) centimeters, in order that the acoustic vibration transducer 10 can be installed across the back of a seat (not shown) without blocking, for example, the passageway between rows of seats. Alternatively the acoustic vibration transducer 10 can be installed in the base of the seat. Additionally, the over all shape of the acoustic vibration transducer 10 is preferably elongate and cylindrical which, amongst other advantages, simplifies its attachment to a given surface. Note, however, that in a particular application the diameter of the acoustic vibration transducer 10 may be equal or slightly larger than its over all length (not shown).

The inductive coil 34 is typically driven with a complex sinusoidal audio signal between 1 and 200 Hertz output from an appropriate amplifier. A typical source of such a signal would be the sub-woofer output on a conventional surround sound audio amplifier. Tests with an accelerometer have shown that the response of the acoustic vibration transducer unit 10 to an input sinusoid is very good with virtually flat response over the entire 1-200 Hertz band.

Referring now to FIG. 3 an illustrative embodiment of a system for inducing system multi-frequency acoustic vibrations in a seat 50 is disclosed. The seat 50 has a backrest 52 comprising a rear panel 54 made of a rigid material, for example laminated wood or fibreglass. Illustratively, the acoustic vibration transducer unit 10 is securely mounted to the rear panel 54 of the seat 50 a pair of longitudinally spaced apart U-shaped braces as in 56 each having two opposite ends screwed into the rear panel 54.

Referring now back to FIG. 1 in addition to FIG. 3, the acoustic vibration transducer unit 10 is mounted such that the axis of direction of movement of the actuating element 14 is substantially parallel to the surface of the backrest 52. Although in this illustrative embodiment the acoustic vibration transducer unit 10 is mounted such that this axis is parallel to the ground, in a particular embodiment the acoustic vibration transducer unit 10 could also be mounted such that this axis is not parallel to the ground.

Figure 4:
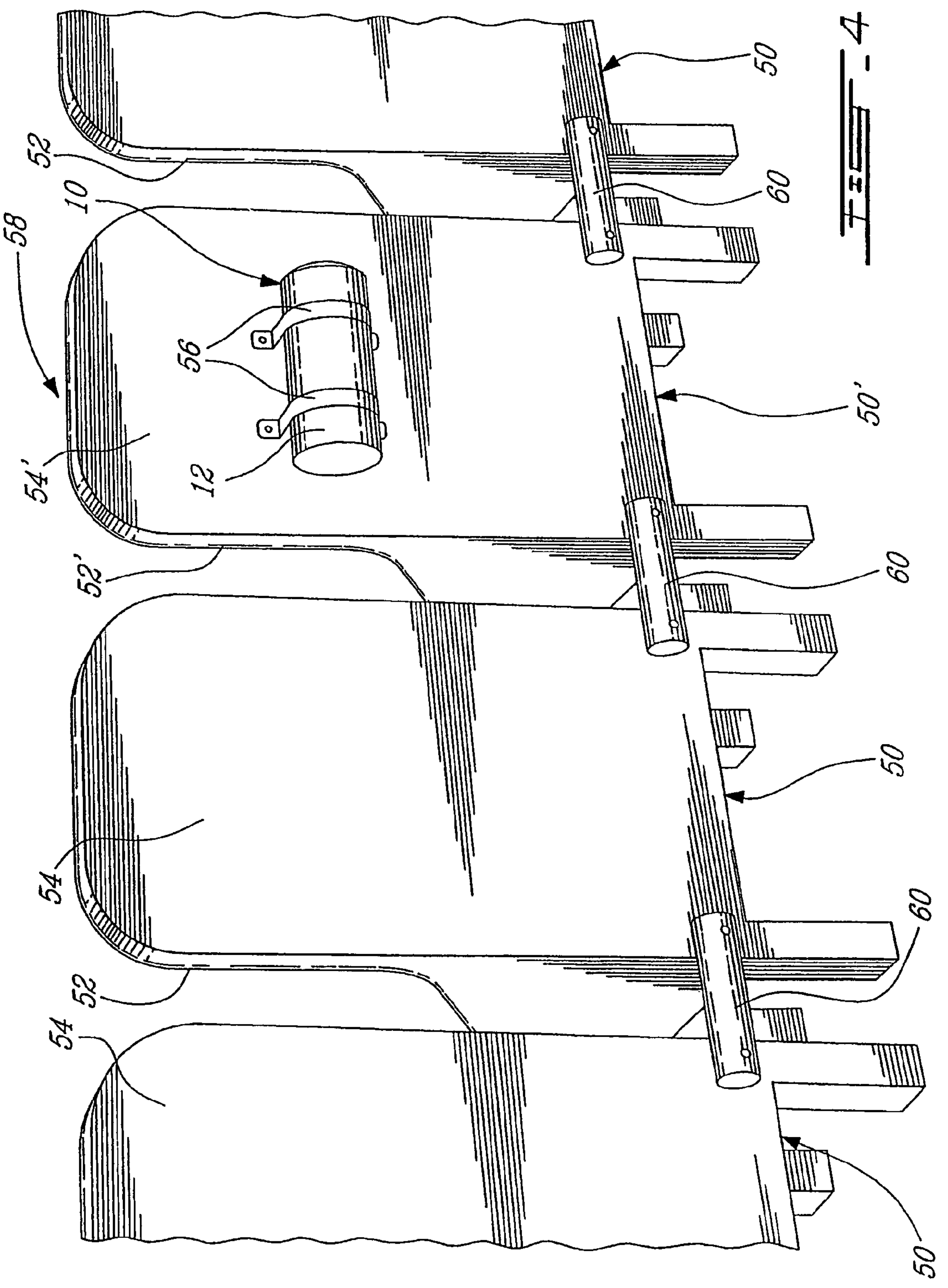
FIG. 4 is an elevated back view of a system for inducing multi-frequency acoustic vibrations in a series of structures in accordance with a particular illustrative embodiment of the present invention.

Referring now to FIG. 4, another illustrative embodiment is concerned with a system for inducing multi-frequency acoustic vibrations in a row 58 of seats 50 of a movie theatre. In this illustrative embodiment, each seat 50 has a backrest 52 comprising a rear panel 54 made of rigid material such as laminated wood or fibreglass. The row of seats 50 then forms a series of vibration-propagating structures.

In the illustrative embodiment of FIG. 4, the acoustic vibration transducer unit 10 is fastened to the rear of the backrest 52 through a pair of longitudinally spaced apart U-shaped braces as in 56 each having two opposite ends screwed into the rear panel 54. Also, the rear panels 54 of each pair of mutually adjacent seats 50 are mechanically interconnected through a section of metallic tube 60. Each section of metallic tube 60 has two opposite ends respectively screwed into the rear panels 54 of the corresponding pair of mutually adjacent seats 50.

To efficiently transfer the multi-frequency acoustic vibrations from the acoustic vibration transducer unit 10 to the rear panel 54' of the seat 50', the housing 12 of the acoustic vibration transducer unit 10 is mounted generally parallel to this rear panel 54' and in physical contact therewith. The multi-frequency acoustic vibrations then propagate through the rear panel 54' and then through the entire structure of the seat 50'. Of course, a person sitting in the seat 50' will experience these vibrations with an intensity depending on the amplitude of the multi-frequency acoustic vibrations.

In operation, the multi-frequency acoustic vibrations generated in the housing 12 are transferred to and propagate through the rear panel 54' of the seat 50'. Then the multi-frequency acoustic vibrations will propagate from rear panel 54 to rear panel 54 through the sections of metallic tubes 60 in two opposite directions parallel to the row of seats 50. In order to ensure efficient propagation of the multi-frequency acoustic waves:

the acoustic vibration transducer unit 10 is disposed substantially horizontal to the ground and substantially parallel to the row of wooden rear panels 54; and the metallic tubes 60 are also disposed horizontal to the ground and substantially parallel to the row of wooden rear panels 54, therefore substantially parallel to the housing 12 of the acoustic vibration transducer unit 10.

The multi-frequency acoustic vibrations propagated through each rear panel 54 are thus transferred through the entire structure of the corresponding seats 50. Persons sitting in the seats 50 will experience these vibrations with an intensity depending on the amplitude of the multi-frequency acoustic vibrations. Tests with an accelerometer have shown that the amplitude of the vibrations and therefore the sensation of vibration experienced by a person sitting in one of the seats 50 is comparable for all seats 50. However, tests have also revealed that the number of seats 50 which can be driven by a single acoustic vibration transducer unit 10 without seriously degrading performance will depend on a number of factors including:

the materials used to fabricate the rear panels 54;

the co-alignment of the rear panels 54;

the co-alignment of the series of metallic tubes 60; and the alignment of the series of metallic tubes 60 with the housing 12 of the acoustic vibration transducer unit 10.

Therefore, efficient propagation of the multi-frequency acoustic vibrations through the row of seats 50 is obtained when the acoustic vibration transducer unit 10 and the metallic tubes 60 are oriented in the direction of propagation of these multi-frequency acoustic vibrations. More specifically, the acoustic vibration transducer unit 10 and the metallic tubes 60 are substantially horizontal and substantially parallel to the row of seats 50.

Figure 5:
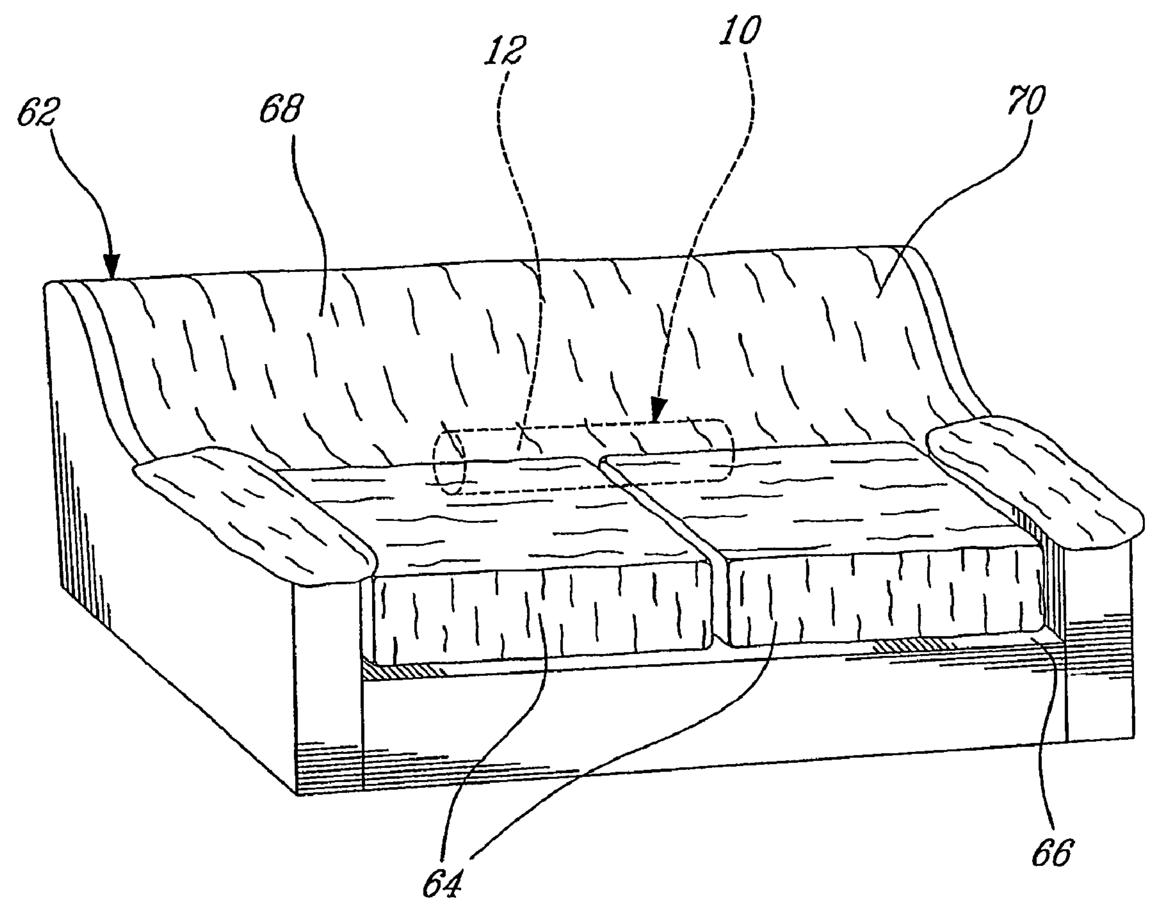
FIG. 5 is an elevated front view of a system for inducing multi-frequency acoustic vibrations in a structure in accordance with an alternative illustrative embodiment of the present invention.

Referring now to FIG. 5, an alternative illustrative embodiment is concerned with a system for inducing multi-frequency acoustic vibrations in a seating unit 62 comprised of seat cushions as in 64 resting on a stable support 66, a rigid back rest 68 and a comfortable upholstered covering 70 on the backrest 68. In this illustrative embodiment the diameter of the housing 12 of the acoustic vibration transducer unit 10 is preferably small enough to be placed behind and underneath the cushions 64. In order to ensure efficient propagation of acoustic vibrations, the acoustic vibration transducer unit 10 is positioned parallel to the stable support 66 and back rest 68 and transverse to the direction of seating on the seating unit 62.

Still referring to FIG. 5, a suitable diameter of the housing 12 is about five (5) centimeters. The acoustic vibration transducer unit 10 is preferably centred on the seating unit 62 and the housing 12 of sufficient length that it spans a large portion of the length of the seating unit 62. Additionally, tests have shown that the acoustic vibration transducer unit 10 functions well in this embodiment without securely fastening the housing 12 to the seating unit 62, thereby greatly simplifying the installation and removal of the acoustic vibration transducer unit 10.

Although the present invention has been described using by way of example the transmission of vibrations derived from an audio signal, the present invention has many other potential uses. For example, an adjustable or programmable complex signal generator could be used as input to the acoustic vibration transducer unit 10 and the system applied for therapeutic purposes. Additionally, the system could also serve as a component in a vibration reduction system. For example, the engine of a motor vehicle or aircraft typically generate vibrations which are perceived by the passengers and often found unpleasant. By supplying the acoustic vibration transducer unit 10 with a signal generated to take advantage of phase cancellation techniques the perception of unpleasant vibrations can either be reduced or completely suppressed.

Although the present invention has been described hereinabove by way of an illustrative preferred embodiment thereof, this embodiment can be modified at will, within the scope of the present invention, without departing from the spirit and nature of the subject of the present invention.

The embodiments of the invention in which an exclusive property or privilege is claimed are defined as follows:

What is claimed is:

1. A method of inducing multi-frequency acoustic vibrations in a vibration-propagating structure, comprising:

positioning an elongate vibrating member generally parallel to and in physical contact with the structure; and producing in said elongate vibrating member the multi-frequency acoustic vibrations by deflecting an actuating element within and coaxial to said elongate vibrating member, wherein the actuating element induces the multi-frequency acoustic vibrations having frequencies and magnitudes related to those present in an input signal, the multi-frequency acoustic vibrations propagating both through said elongate vibrating member and the structure in physical contact with said elongate vibrating member to induce in the structure the multi-frequency acoustic vibrations, wherein the multi-frequency acoustic vibrations are inaudible.

2. A method of inducing multi-frequency acoustic vibrations in a series of vibration-propagating structures, comprising:

positioning an elongate vibrating member in physical contact with a first one of the structures and in a direction generally parallel to the series of structures, said direction constituting a direction of propagation of the multi-frequency acoustic vibrations;

interconnecting each pair of mutually adjacent structures of the series through an elongate vibration-propagating member generally parallel to said direction of propagation;

producing in said elongate vibrating member the multi-frequency acoustic vibrations by deflecting an actuating element within and coaxial to said elongate vibrating member, wherein the actuating element induces the multi-frequency acoustic vibrations having frequencies and magnitudes related to those present in an input signal; and propagating the multi-frequency acoustic vibrations in said direction of propagation from said elongate vibrating member, the first structure, and the other structures of the series through said elongate vibration-propagating members, wherein the multi-frequency acoustic vibrations are inaudible.

3. A system for inducing multi-frequency acoustic vibrations in a vibration-propagating structure, comprising:

an elongate vibrating member for being positioned generally parallel to and in physical contact with the structure;

an actuating element within and coaxial to the elongate vibrating member; and a generator of the multi-frequency acoustic vibrations connected to said elongate vibrating member;

wherein, in operation, said generator produces the multi-frequency acoustic vibrations in said elongate vibrating member by deflecting the actuating element within said elongate vibrating member, wherein the actuating element induces the multi-frequency acoustic vibrations having frequencies and magnitudes related to those present in an input signal, and the multi-frequency acoustic vibrations propagate both through said elongate vibrating member and the structure in physical contact with said elongate vibrating member to induce in said structure the multi-frequency acoustic vibrations, wherein the multi-frequency acoustic vibrations are inaudible.

4. A vibration inducing system as defined in claim 3, wherein said generator is mounted within said elongate vibrating member to form an elongate acoustic vibration transducer unit.

5. A vibration inducing system as defined in claim 4, wherein:

the vibration-propagating structure comprises a seating unit with cushions; and said elongate acoustic vibration transducer unit is adapted to be positioned parallel to and transversally of said seating unit between said cushions of said seating unit.

6. A vibration inducing system as defined in claim 4, wherein:

the vibration-propagating structure comprises a seating unit with a backrest having a rear face; and said elongate acoustic vibration transducer unit is fastened horizontally and transversally to said rear face of said backrest, said elongate vibrating member extending generally parallel to said rear face of said backrest.

7. A system for inducing multi-frequency acoustic vibrations in a series of vibration-propagating structures, comprising:

an elongate vibrating member for being positioned in physical contact with a first one of the structures and in a direction generally parallel to the series of structures, said direction constituting a direction of propagation of the multi-frequency acoustic vibrations;

an actuating element within and coaxial to the elongate vibrating member;

a generator of said multi-frequency acoustic vibrations connected to said elongate vibrating member;

an elongate vibration-propagating member for interconnecting each pair of mutually adjacent structures of the series, said elongate vibration-propagating member being generally parallel to said direction of propagation;

wherein, in operation, said generator produces the multi-frequency acoustic vibrations in said elongate vibrating member by deflecting the actuating element within said elongate vibrating member, wherein the actuating element induces the multi-frequency acoustic vibrations having frequencies and magnitudes related to those present in an input signal, and the multi-frequency acoustic vibrations propagate in said direction of propagation from said elongate vibrating member, the first structure, and the other structures of the series through the elongate vibration-propagating members, wherein the multi-frequency acoustic vibrations are inaudible.

8. A vibration inducing system as defined in claim 7, wherein said the elongate vibrating member is cylindrical.

9. A vibration inducing system as defined in claim 7, wherein said generator is mounted within said elongate vibrating member to form an acoustic vibration transducer unit.

10. A vibration inducing system as defined in claim 7, wherein said elongate vibration-propagating members are tubular.

11. A vibration inducing system as defined in claim 7, wherein:

the vibration-propagating structures each comprise a seating unit with a backrest having a rear face; and said elongate vibrating member is fastened to said rear face of said backrest of one of said seating units corresponding to said one structure, said elongate vibrating member extending generally parallel to said direction of propagation of the multi-frequency acoustic vibrations.

12. A vibration inducing system as defined in claim 7, wherein:

the series of vibration-propagating structures comprises a row of seating units each having a backrest with a rear face; and said elongate vibration-propagating members each interconnect said rear faces of said backrests of two adjacent seating units corresponding to one pair of mutually adjacent vibration-propagating structures, said elongate vibration-propagating members extending generally parallel to said direction of propagation of the multi-frequency acoustic vibrations.

* * * * *